United States Patent
Fang et al.

(10) Patent No.: US 6,251,711 B1
(45) Date of Patent: Jun. 26, 2001

(54) METHOD FOR FORMING BRIDGE FREE SILICIDE

(75) Inventors: Edberg Fang, Yun-Lin; Wen-Yi Hsieh; Teng-Chun Tsai, both of Hsin-Chu, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/531,108

(22) Filed: Mar. 17, 2000

(51) Int. Cl.$^7$ .................................................. H01L 21/335

(52) U.S. Cl. .................. 438/142; 438/185; 438/233; 438/299; 438/303; 438/305; 438/586; 438/683; 438/651; 437/41; 437/52; 437/200

(58) Field of Search ..................... 438/142, 303, 438/305, 586, 651, 683, 233, 299, 185; 437/200, 41, 52

(56) References Cited

U.S. PATENT DOCUMENTS

| | | | |
|---|---|---|---|
| 4,873,205 | * 10/1989 | Critchlow et al. | 437/200 |
| 4,983,544 | * 1/1991 | Lu et al. | 437/200 |
| 5,753,557 | * 5/1998 | Tseng | 438/303 |
| 5,783,486 | * 7/1998 | Tseng | 438/682 |

* cited by examiner

*Primary Examiner*—Richard Elms
*Assistant Examiner*—Pho Luu

(57) ABSTRACT

The proposed invention is a salicide process that is used to avoid bridge phenomena. In short, the proposed method for forming silicide without bridge phenomena comprises following steps: providing a substrate with a pad layer on the substrate; forming a first cap layer on the pad layer; defining a trench region; removing part of both the pad layer and the first cap layer that are located inside the trench region such that a trench is formed; filling the trench by a gate oxide layer and a polysilicon layer in sequence; capping a first metal layer on the polysilicon layer; performing a first rapid thermal process to form a first silicide layer over the gate oxide layer; removing excess the first metal layer; forming a second cap layer on the first silicide layer; planarizing surface of both the first cap layer and the second cap layer; removing the first cap layer; removing part of the pad layer that is not covered by the gate oxide layer and then a gate structure being formed; forming two light doped drain in the substrate; forming a spacer on sidewall of the gate structure; forming a sources and a drain in the substrate, herein the source and the drain is located around the light doped drains; forming some second metal layers on both the source and the drain; performing a second thermal process to form two second silicide layer over the source and the drain; removing excess the second metal layer; and then forming a third rapid thermal process.

22 Claims, 7 Drawing Sheets

METHOD FOR FORMING BRIDGE FREE SILICIDE

BACKGROUND OF THE INVENTION

1. Field of the Invention

The proposed invention relates to a method for forming bridge free silicide, and more particularly to a method not only improves quality of salicide but also provides a self-aligned contact process in the self-aligned salicide process.

2. Description of the Prior Art

Silicide is an important field in contemporary semiconductor fabrication. Advantages of silicide comprise lower contact resistance, withstand high temperature and allowable of self-alignment process. Further, silicides usually are formed by reacting refractory or near noble metals with silicon. Among them are titanium silicide (TiSi2), cobalt silicide (CoSi2), tungsten silicide (Wsi2), platinum silicide (Ptsi2), molybdenum silicide (MoSi2), palladium silicide (PdSi2), and tantalum silicide (TaSi2).

However, owing to the fact that a higher temperature annealing is need to carry out those refractory metal silicide, an unavoidable issue is the bridge phenomena that means the silicide on gate is connected to the silicide on source/drain and then an unexpected short is happened. Sequentially, the bridge phenomena can be further illustrated in following paragraphs.

In conventional salicide process, metal is formed on the gate, the sidewall spacers and the source/drain regions. And then one, two or more annealing processes are performed to react the metal with the polysilicon (silicon) of the gate and the silicon (polysilicon) of the source/drain to form silicide. Following these annealing process, an etching process is performed to remove any unreacted metal.

One of principal functions of sidewall spacers is to separate silicide on the gate from silicide on the source/drain. However, despite the incorporation of spacers, silicide also may form laterally and easily bridge the separation between the gate and the source/drain. Then the gate is shorted to the source/drain, and so-called "bridge phenomena" occurs. In addition, silicon (polysilicon) diffuses into the metal that covers the sidewall spacers and subsequently reacts with the metal.

Moreover, some conditions tend to favor lateral silicide formation. For examples, conventional furnace annealing in an inert gas atmosphere may foster rapid lateral silicide formation. On the other hand, processing in the sub-0.25 .mu.m processing, the minimum gate width may approach or even reach the dimensions of the grain boundaries between the individual grains of the gate, and then these grain boundaries act as natural barriers to silicon diffusion. Another possible reason of lateral silicide formation is that diffusion of silicon (polysilicon) is unavoidable and then unexpected silicide may be formed on sidewall spacers. Obviously, when scale is reduced danger of the unexpected silicide is increased.

In summary, it is beyond any doubt that bride phenomena is serious issue in application of silicide, and then a method to overcome the issue is instantly required.

SUMMARY OF THE INVENTION

A principal object of the present invention is to provide a manufacturable method for forming silicide without bridge phenomena.

Another object of the present invention is to provide a practical silicide scheme that provides a self-aligned contacted process in conventional self-aligned silicide process.

A further object of the present invention is to provide a salicide process that not only overcomes bridging issue but also reserves self-alignment advantage of silicide.

In short, first preferred embodiment is a method comprises following steps: providing a substrate with a pad layer on the substrate; forming a first cap layer on the pad layer; defining a trench region; removing part of the pad layer and part of the first cap layer that are located inside the trench region such that a trench is formed; filling the trench by a gate oxide layer and a polysilicon layer in sequence; capping a first metal layer on the polysilicon layer; performing a first rapid thermal process to form a first silicide layer over the gate oxide layer; removing excess the first metal layer; forming a second cap layer on the first silicide layer; planarizing surface of both the first cap layer and the second cap layer; removing the first cap layer; removing part of the pad layer that is not covered by the gate oxide layer and then a gate structure being formed; forming two light doped drain in the substrate; forming a spacer on sidewall of the gate structure; forming a sources and a drain in the substrate, herein the source and the drain is located around the light doped drains; forming some second metal layers on both the source and the drain; performing a second thermal process to form two second silicide layer over the source and the drain; removing excess the second metal layer; and then forming a third rapid thermal process.

In comparison, another preferred embodiment is a process comprises following steps: providing a substrate that is covered by a first cap layer; forming a trench in the first cap layer; filling the trench by a dielectric layer and a polysilicon layer in sequence; forming a first silicide layer on the dielectric layer; forming a second cap layer on the first silicide layer; removing part of the first cap layer that is outside the trench and then a gate structure being formed; forming a spacer, a source and a drain around the gate structure; forming a second silicide layer on the source and the drain; forming a third cap layer to cover the substrate after second silicide layer is formed; and forming two contacts in the third cap layer, wherein one contact is connected to source and another contact is connected to drain.

BRIEF DESCRIPTION OF THE DRAWINGS

In the accompanying drawing forming a material part of this description, there is shown:

FIG. 2A to FIG. 2I are a series of qualitative cross-section illustration about essential steps of one preferred embodiment of the invention.

DESCRIPTION OF THE PREFERRED EMBODIMENT

In order to detail explain the invention, some figures are used to illustrate essential steps of two embodiments of the proposed invention and are discussed in following paragraphs. These provided embodiments include a method for forming salicide without bridge phenomena and a two steps salicide process.

First of all, the inventor found that flow of silicide (or flow of silicon/polysilicon) induces bridge phenomenon and in conventional salicide process no silicide is totally isolated from other silicide. For example, the silicide on gate may flow through surface of spacer and then contacts with the silicide on source/drain. Therefore, an essential way to prevent formation of bridge is totally isolate the silicide on gate form the silicide on source/drain, and then no bridge will be formed.

Figure 1:
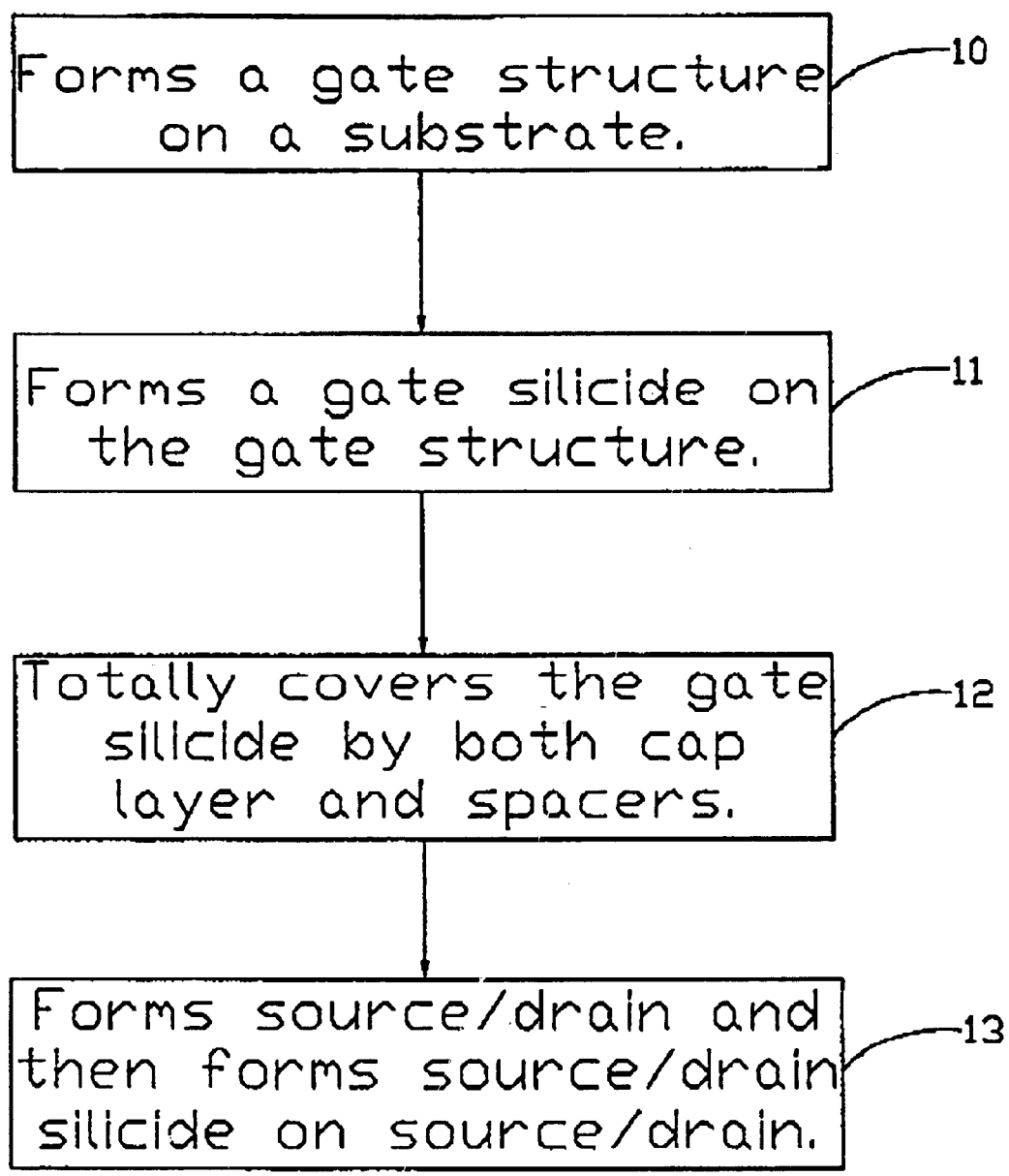
FIG. 1 is an essential flow chart of the invention.

Therefore, the inventor presents a method for preventing appearance of bridge phenomena. As the flow chart shown in FIG. 1, the method comprises following basic steps: First, as gate structure block 10 shows, forms a gate structure on a substrate, wherein the gate structure comprises a gate dielectric layer and a conductor layer that is located over said gate dielectric layer; then, as gate silicide block 11 shows that forms a gate silicide layer on the gate structure; totally covers the gate silicide by both a cap layer and a plurality of spacers; forms a source and a drain in the substrate, as shown in isolate block 12; and forms some source/drain silicides on both drain and gate, as source/drain silicide block 13 shows.

Significantly, one main characteristic of the invention is that gate silicide is totally isolated from source/drain, and then during forming process of source/drain silicide no bridge is formed by flowing gate silicide or diffusion of source/drain silicide. Moreover, any unexpected silicide is removed before gate silicide is covered, and then risk of bridge is further decreased.

First preferred embodiment of the present invention is a method for forming silicide without bridge phenomena. Moreover, these essential steps of the method are illustrated in following paragraph with FIG. 2A to FIG. 2I.

Figure 2A:
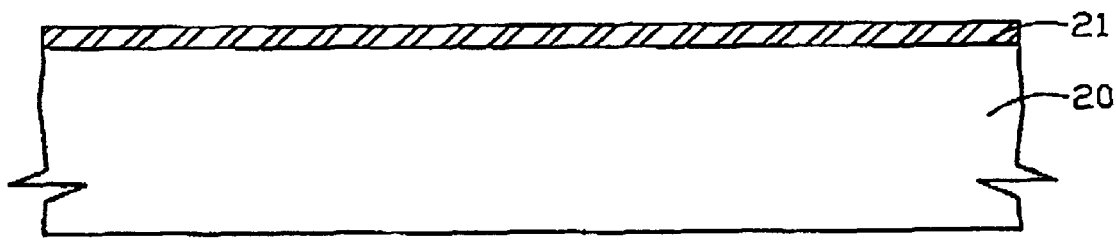

Referring to FIG. 2A, provides substrate 20 with pad layer 21 that is located on the substrate. Herein, substrate 20 usually comprises some structures such as isolation and well, and available varieties of isolation comprises shallow trench isolation and field oxide. And pad layer 21 usually is a pad oxide layer.

Figure 2B:
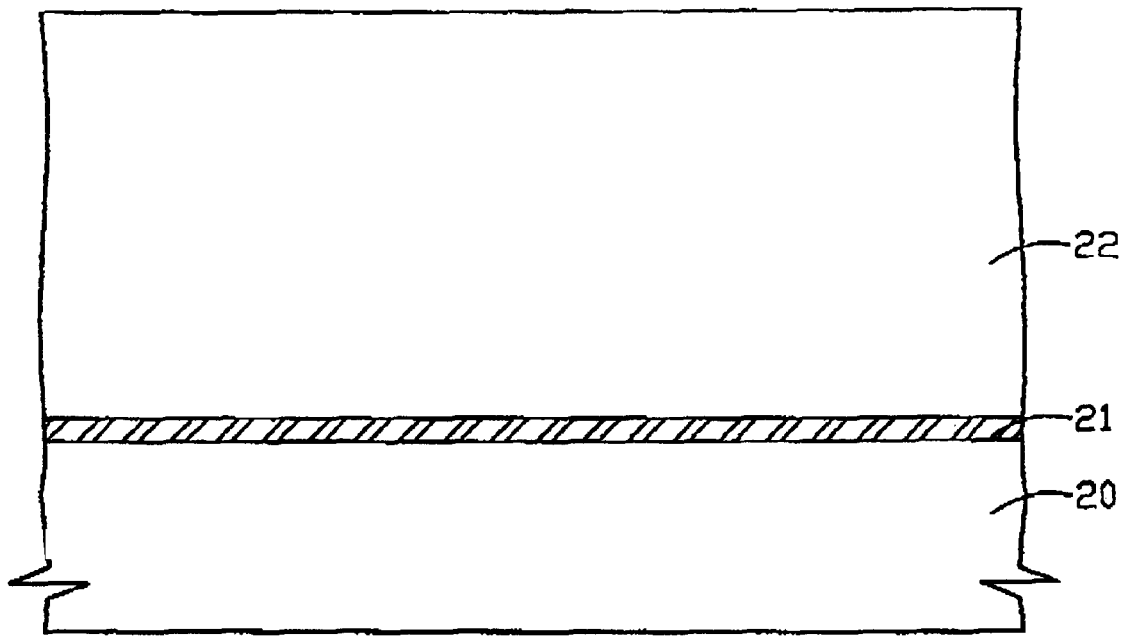

As shown in FIG. 2B, forms first cap layer 22 on pad layer 21 and then define a trench region, where the trench region is prepared to form gate in following steps.

Figure 2C:
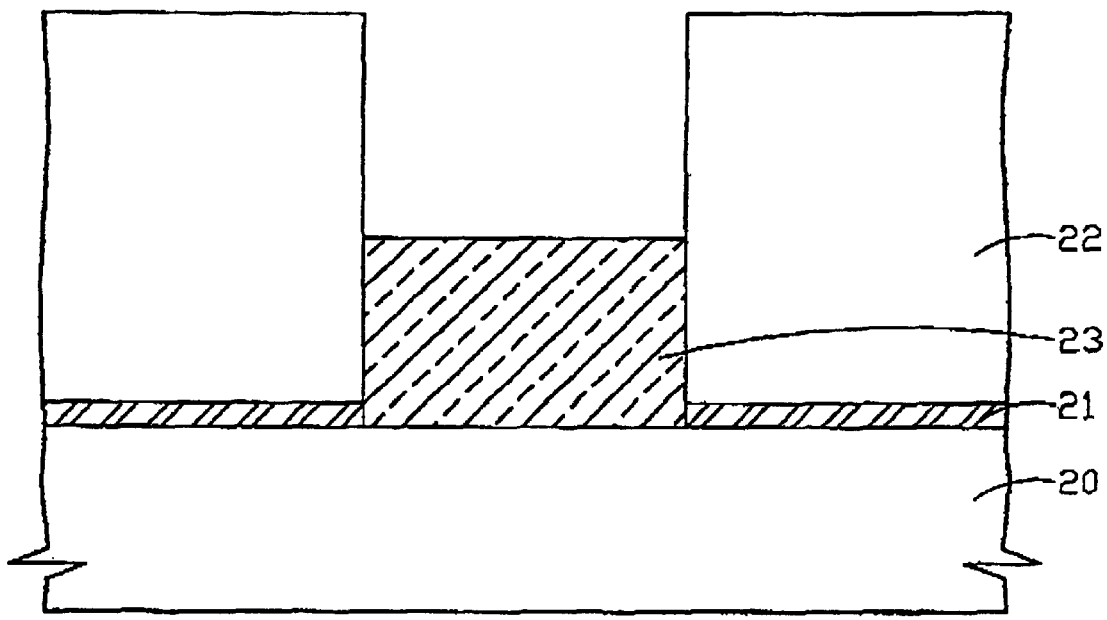

As FIG. 2C shows, removes part of first cap 22 layer that is located inside the trench region such that a trench is formed, and then fills the trench by gate oxide layer 23 and polysilicon layer 24 in sequence.

Figure 2D:
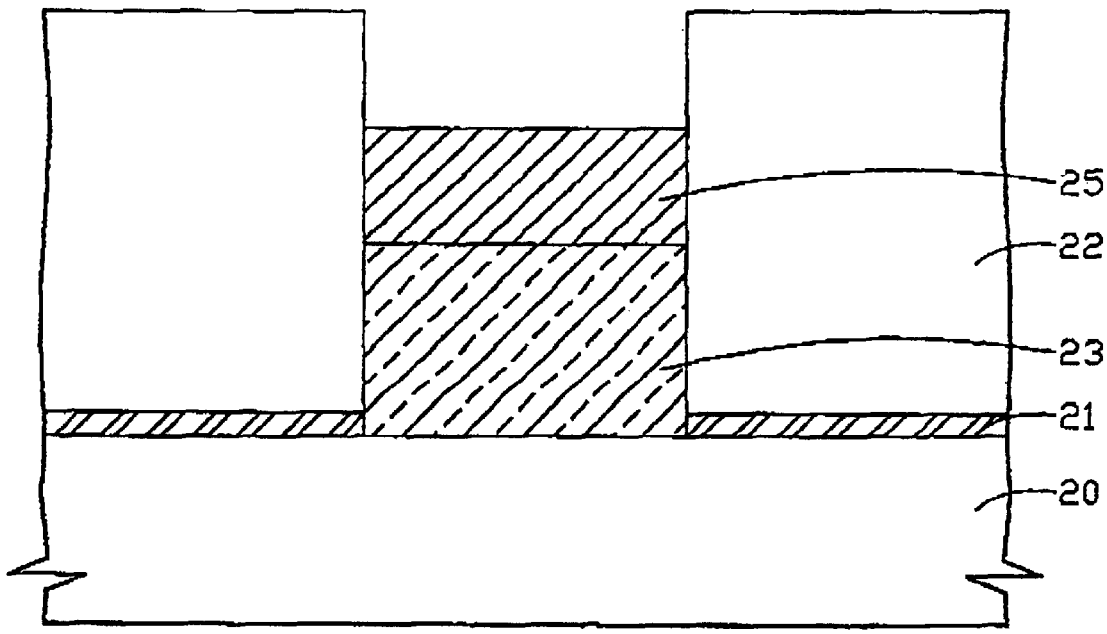

Next, referring FIG. 2D, caps first metal layer on polysilicon layer 24 and perform a first rapid thermal process to form first silicide layer 25 over gate oxide layer 23, and then removes excess the first metal layer. Herein, available varieties of said first metal layer comprise Titanium, Cobalt, Tungsten, Platinum, Molybdenum, Palladium and Tantalum. Further, temperature of said first rapid thermal process is about 500° C. to 800° C. It should be emphasized that though conventional salicide process comprises two rapid thermal process that temperature of later rapid thermal process is higher than temperature of former repaid thermal process, but only the former rapid thermal process is processed now to reduce forming probability of unexpected first silicide layer 25 that is not located over gate oxide layer 23.

Moreover, an optional step is to remove any unexpected first silicide layer 25 that is not located over gate oxide layer 23. Another optional step is to remove part of polysilicon layer 24 before the first metal layer is formed, wherein the removed part of polysilicon layer 24 is not located inside the trench region.

Figure 2E:
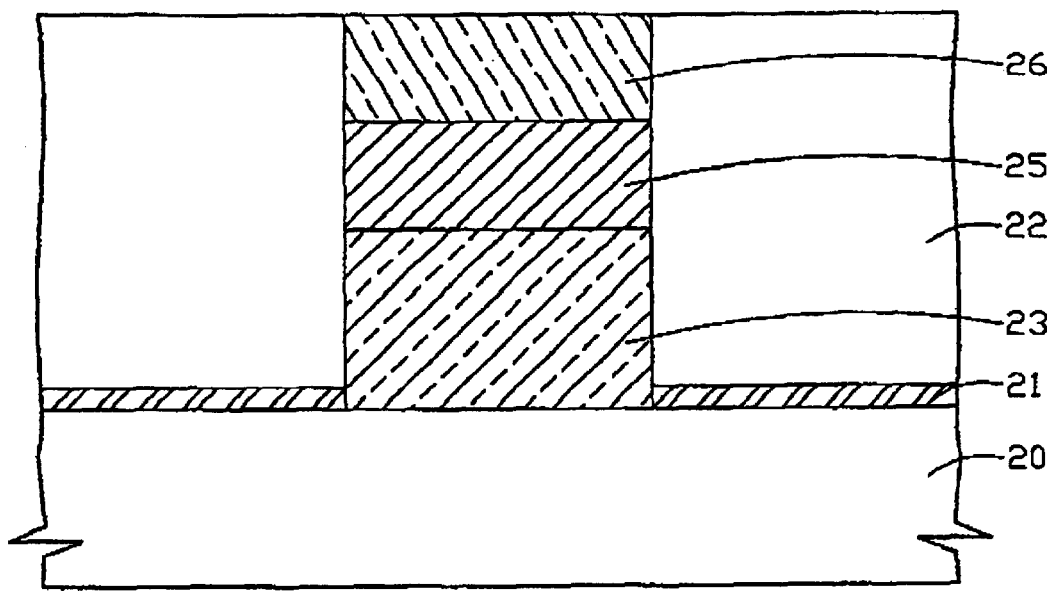

FIG. 2E shows the next step: forms second cap layer 26 on first silicide layer 25 and then planarizes surface of both first cap layer 22 and second cap layer 26. Herein, etch selective ration between first cap layer 22 and second cap layer 26 is larger than twenty. And available materials of second cap layer 26 comprise silicon nitride. Beside, available methods for planarizing surface of both first cap layer 22 and second cap layer 26 comprise chemical mechanical polishing.

Figure 2F:
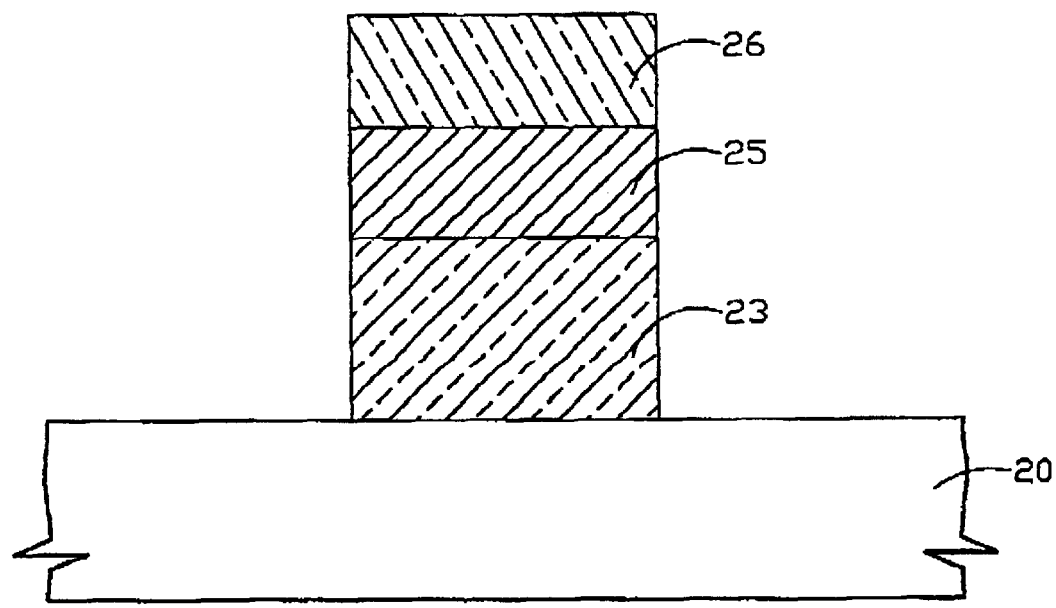

Following, as shown in FIG. 2F, removes first cap layer 22 and removes part of pad layer 21 that is not covered by gate oxide layer 23, and then a gate structure is formed. Again, an optional step is to remove any unexpected second cap layer 26 that is not located inside the trench region before gate structure is formed.

Figure 2G:
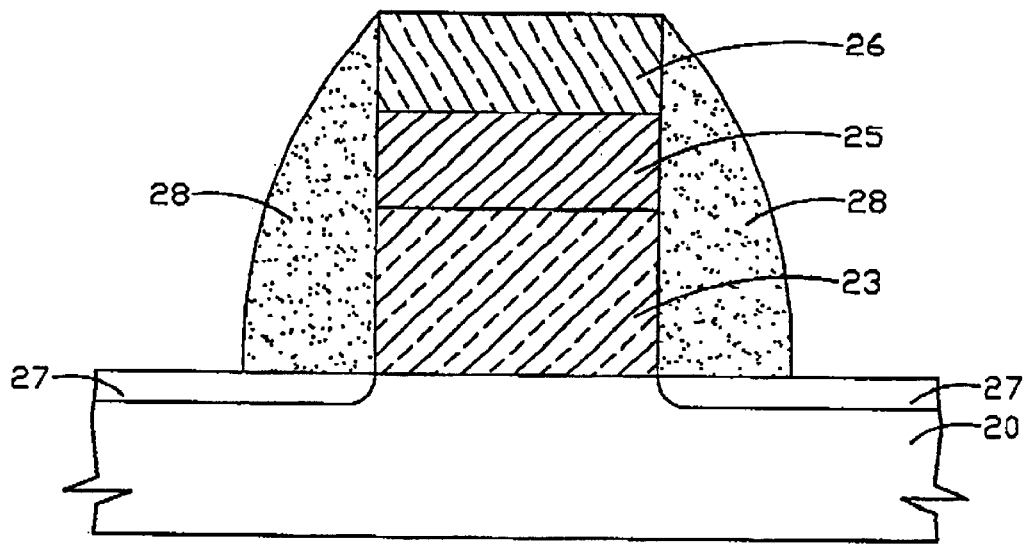

Then as FIG. 2G shows, forms two light doped drains 27 in substrate 20 and then forms spacer 28 on sidewall of the gate structure. Herein, available materials of spacers 28 comprise silicon nitride.

Figure 2H:
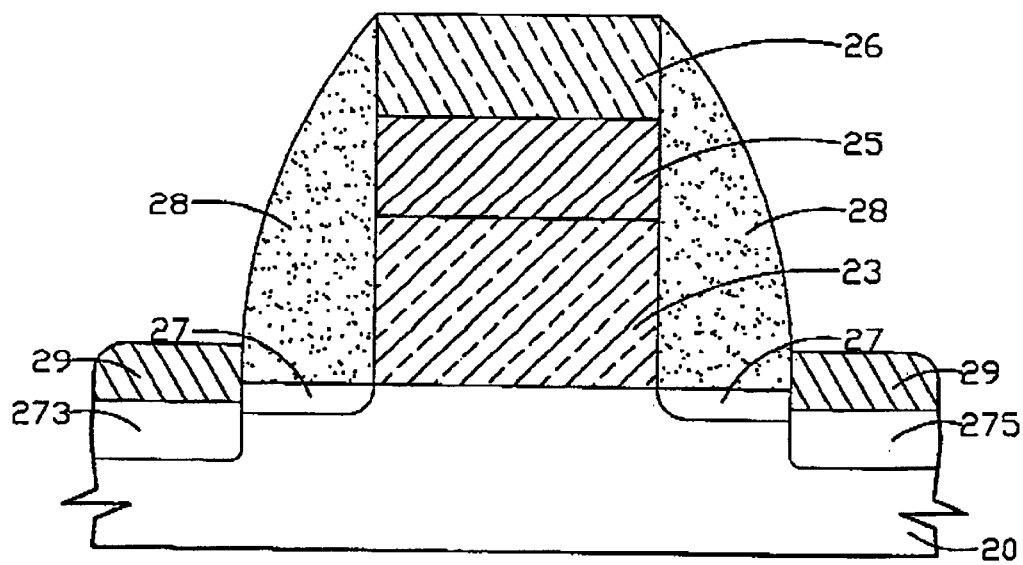
Figure 21:
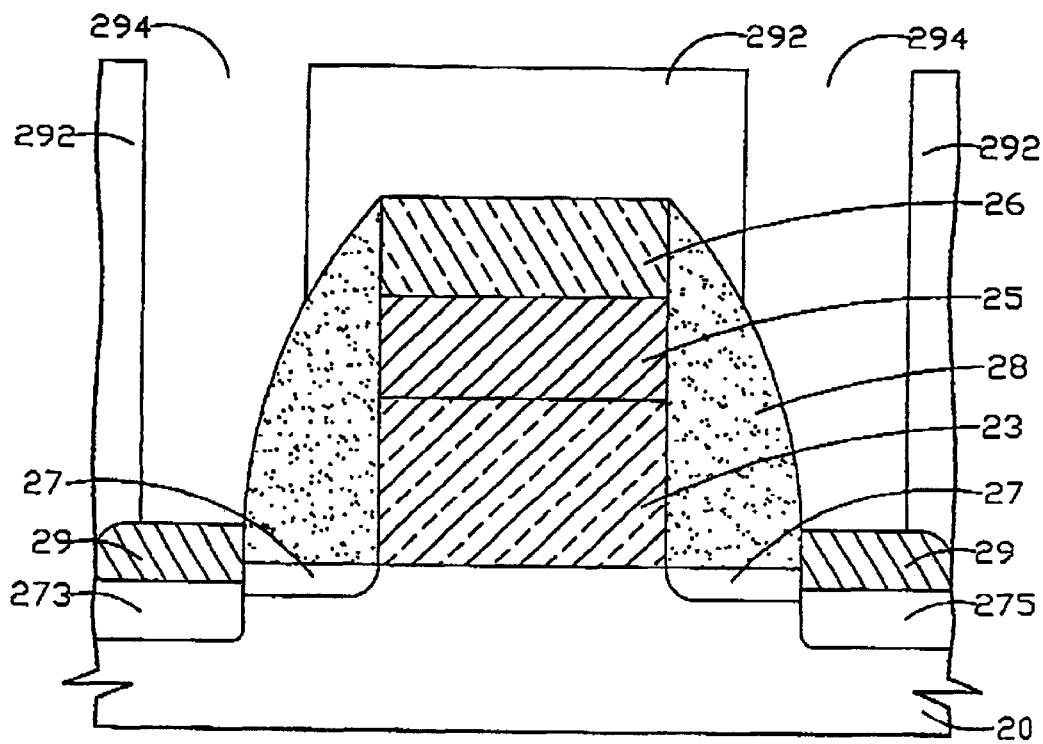
Figure 3:
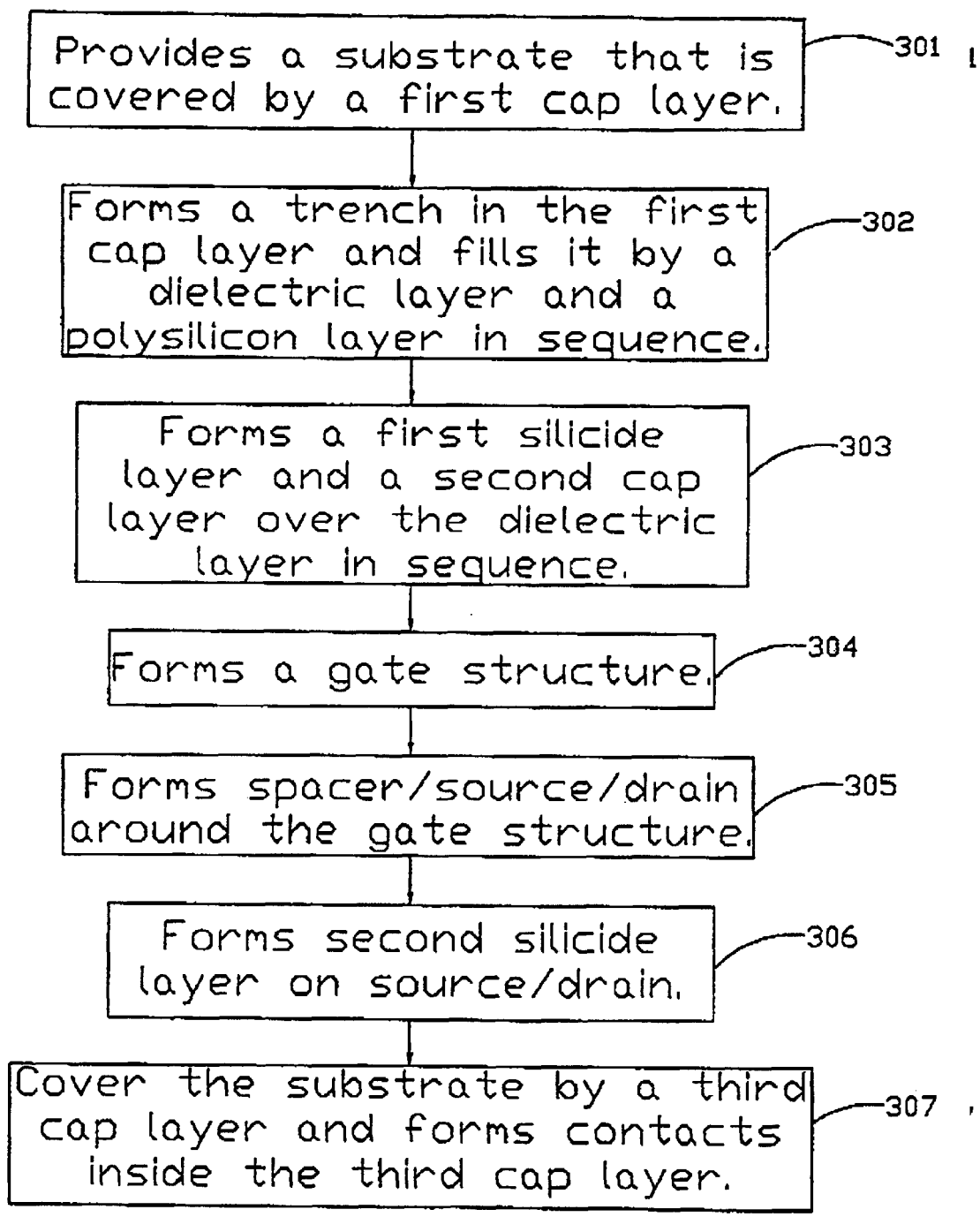
FIG. 3 is an essential flow chart of essential steps of another preferred embodiment of the invention.

Referring to FIG. 2H, forms source 273 and drain 275 in substrate 20, herein source 273 and drain 275 is located around light doped drains 27. Next, forms second metal layers on both source 273 and drain 275, and then performs a second thermal process to form two second silicide layers 29 over source 273 and drain 275. In additional, available varieties of said second metal layer comprise Titanium, Cobalt, Tungsten, Platinum, Molybdenum, Palladium and Tantalum. Beside, temperature of said second rapid thermal process is about 500° C. to 800° C. In other words, only the former rapid thermal process of the second thermal process is processed and the later rapid thermal process is not yet processed. Finally, removes excess second metal layer and then forming a third rapid thermal process.

Significantly, the third rapid thermal process is the later rapid thermal process of salicide process of first silicide layer 25, and the third rapid thermal process also is the later rapid thermal process of salicide process of second silicide layer 29. Herein, temperature of the third rapid thermal process is about 800° C. to 1000° C.

In summary, from FIG. 2D to FIG. 2H, first silicide layer 25 is formed and also is totally covered by both second cap layer 26 and spacers 28. Therefore, first silicide layer 25 is totally isolated from substrate 20 and any thing that located in and on substrate 20. Then during formation of second silicide layer 29, it is impossible to form any bridge between first silicide layer 25 and second silicide layer 29.

Furthermore, following optional steps are introduced to provide a self-aligned contacted process in the proposed method. Referring to FIG. 2I, forms third cap layer 292 to cover substrate 20 after the third rapid thermal process is finished, wherein both the gate structure and second silicide layer 29 are covered by the third cap layer. And then forms two contact holes 294 in third cap layer 292, wherein one contact hole 294 is connected to source 273 and another contact hole 294 is connected to drain 275. Of course, contacts 294 are connected to source 273 and drain 275 through second silicide layers 29. And contacts can be formed by directly fill contact holes 294 by conductive materials. Significantly, in order to overpass the deviation of photolithography and to overcome the difficult that size of drain 273/drain 275 is smaller than available contact hole size of contemporary fabrication. The etch selective ration between third cap layer 292 and second cap layer 26 is as larger as possible, and the etch selective ration between third cap layer 292 and spacer 28 also is as larger as possible. Herein, an adequate etch selective ration is larger than twenty. Additional, available materials of third cap layer 292 comprise oxide. In short, as FIG. 2I shows, self-aligned contacted process can be processed by properly modifying etch selective ration between third cap layer 292, second cap layer 26 and spacer 28.

Another preferred embodiment is a two steps salicide process that comprises following steps: First, as base block 301 shows that provides a substrate that is covered by a first cap layer. Then, as trench block 302 shows that forms a trench in the first cap layer and then fills the trench by a dielectric layer and a polysilicon layer in sequence. Next, as first salicide process block 303 shows, forms a first silicide layer on the dielectric layer and then forms a second cap layer on the first silicide layer. And then, as gate block 304 shows, removes part of the first cap layer that is outside the trench and then a gate structure is formed. Next, as shown in isolate block 305, forms a spacer, a source and a drain around the gate structure. And then, as second salicide process block 306 shows, forms a second silicide layer on the source and the drain. Then, as shown in contact block 307, forms a third cap layer to cover the substrate after the second silicide layer is formed, and then forms some (for example two) contacts in the third cap layer, wherein these contacts are connected to source and drain separated.

Moreover, to properly form required contacts, the etch selective ration between third cap layer and second cap layer is larger than twenty and the etch selective ration between third cap layer and spacer layer also is larger than twenty. The present process also comprises some optional steps. One optional step is that forms a pad layer under the first cap layer when aspect ratio is too large enough to properly filled the trench by the dielectric layer/the polysilicon layer. Another optional step is that forms two light doped regions around the gate structure.

Although specific embodiments have been illustrated and described, it will be obvious to those skilled in the art that various modifications may be made without departing from what is intended to be limited solely by the appended claims.

What is claimed is:

1. A method for forming silicide without bridge phenomena, said method comprising following steps:
   providing a substrate, wherein at least an isolations is located inside said substrate;
   forming a pad layer on said substrate;
   forming a first cap layer on said pad layer;
   defining a trench region;
   removing part of said pad layer and part of said first cap layer that are located inside said trench such that a trench is formed;
   filling said trench by a gate oxide layer and a polysilicon layer in sequence;
   capping a first metal layer on said polysilicon layer;
   performing a first rapid thermal process to form a first silicide layer over said gate oxide layer;
   removing excess said first metal layer that is not reacted in said first rapid thermal process;
   forming a second cap layer on said first silicide layer;
   planarizing surface of both said first cap layer and said second cap layer;
   removing said first cap layer;
   removing part of said pad layer that is not covered by said gate oxide layer and then a gate structure being formed, wherein said gate structure comprises said gate oxide layer, said first suicide layer and said second cap layer;
   forming two light doped drains in said substrate, herein said light doped drains are located around said gate structure;
   forming a spacer on sidewall of said gate structure;
   forming a source and a drain in said substrate; herein said source and said drain are located around said light doped drains;
   forming a plurality of second metal layers on both said source and said drain;
   performing a second thermal process to form two second silicide layers over said source and said drain;
   removing excess said second metal layer that is not reacted in said second thermal process; and
   performing a third rapid thermal process.

2. The method according to claim 1, wherein available varieties of said isolation comprise shallow trench isolation.

3. The method according to claim 1, wherein said pad layer comprises pad oxide layer.

4. The method according to claim 1, wherein available varieties of said first metal layer comprise Titanium, Cobalt, Tungsten, Platinum, Molybdenum, Palladium and Tantalum.

5. The method according to claim 1, wherein temperature of said first rapid thermal process is about 500° C. to 800° C.

6. The method according to claim 1, wherein etch selective ration between said first cap layer and said second cap layer is larger than twenty.

7. The method according to claim 1, wherein available methods for planarizing surface of both said first cap layer and said second cap layer comprise chemical mechanical polishing.

8. The method according to claim 1, wherein available varieties of said second metal layer comprise Titanium, Cobalt, Tungsten, Platinum, Molybdenum, Palladium and Tantalum.

9. The method according to claim 1, wherein temperature of said second rapid thermal process is about 500° C. to 800° C.

10. The method according to claim 1, wherein temperature of said third rapid thermal process is about 800° C. to 1000° C.

11. The method according to claim 1, further comprising forming a third cap layer to cover said substrate after said third rapid thermal process is finished, wherein both said gate structure and said second silicide layer are covered by said third cap layer.

12. The method according to claim 11, further comprising forming two contact holes in said third cap layer, wherein said contact holes are connected to said source and said drain separately.

13. The method according to claim 11, wherein etch selective ration between said third cap layer and said second cap layer is larger than twenty.

14. The method according to claim 11, wherein etch selective ration between said third cap layer and said spacer is larger than twenty.

15. The method according to claim 11, wherein available materials of said third cap layer comprise oxide.

16. The method according to claim 1, wherein available materials of said second cap layer comprise silicon nitride.

17. The method according to claim 1, wherein available materials of said spacer comprise silicon nitride.

18. A two steps salicide process, said process comprising:
   providing a substrate that is covered by a first cap layer;
   forming a trench in said first cap layer;
   filling said trench by a dielectric layer and a polysilicon layer in sequence;
   forming a first silicide layer on said dielectric layer;
   forming a second cap layer on said first silicide layer;
   removing part of said first cap layer that is outside said trench and then a gate structure being formed;
   forming a spacer, a source and a drain around said gate structure;

forming a second silicide layer on said source and said drain;

forming a third cap layer to cover said substrate after said second silicide layer is formed, wherein both said gate structure and said second silicide layer are covered by said third cap layer; and forming two contacts in said third cap layer, wherein one said contact is connected to said source and another said contact is connected to said drain.

19. The process according to claim 18, further comprising forming two light doped regions around said gate structure.

20. The method according to claim 18, wherein etch selective ration between said third cap layer and said second cap layer is larger than twenty.

21. The method according to claim 18, wherein etch selective ration between said third cap layer and said spacer layer is larger than twenty.

22. A method for protecting appearance of bridge phenomena, said method comprises:

forming a gate structure on a substrate, wherein said gate structure comprises a gate dielectric layer and a conductor layer that is located over said gate dielectric layer;

forming a gate silicide layer on said gate structure;

totally covering said gate silicide by both a cap layer and a plurality of spacers;

forming a source and a drain in said substrate; and forming a plurality of source/drain suicides on both said drain and said gate.

* * * * *